Aug. 17, 1971 T. CSAKVARY 3,600,144

LOW MELTING POINT BRAZING ALLOY

Filed June 5, 1969

WITNESSES

Theodore F. Wrobel

James F. Young

INVENTOR

Tibor Csakvary

BY

C. L. Menzemer

ATTORNEY

United States Patent Office 3,600,144
Patented Aug. 17, 1971

3,600,144

LOW MELTING POINT BRAZING ALLOY

Tibor Csakvary, Greensburg, Pa., assignor to Westinghouse Electric Corporation, Pittsburgh, Pa.

Filed June 5, 1969, Ser. No. 830,669
Int. Cl. B32b 15/04
U.S. Cl. 29—195 4 Claims

ABSTRACT OF THE DISCLOSURE

This disclosure relates to a solder and a method for joining a wafer of semiconductor material to a metal electrical contact so that the joined structure has a minimum of deformation as a result of the difference in the coefficient of thermal expansion of the semiconductor material and the metal electrical contact.

BACKGROUND OF THE INVENTION

Field of the invention

This invention is in the semiconductor field generally and specifically in the field of solders and methods of joining a wafer of semiconductor material to a metal electrical contact.

Description of the prior art

It is the current practice to join a silicon wafer, having a p-type or $p^+$-type region adjacent the surface to be joined, to a molybdenum contact with an aluminum or aluminum—0.5% by weight; boron alloy. The components are assembled in a fixture, loaded in a furnace and fused at 700° C. At 660° C., the aluminum melts and dissolves some silicon of the wafer whereby an aluminum-silicon hypereutectic alloy with a solidus temperature of 577° C. is formed.

The fused assembly, consisting of the wafer of semiconductor material joined to the molybdenum contact by the aluminum-silicon eutectic, is cooled to room temperature and removed from the furnace.

Because of the difference in the coefficient of thermal expansion between the silicon wafer and the base contact, the fused assembly is stressed and deformed.

The degree of deformation is proportional to $\Delta T$, the difference between the solidus point of the aluminum or aluminum boron alloy and room temperature.

An object of this invention is to provide a solder suitable for joining a wafer of semiconductor material to a metal electrical contact, the solder having a lower solidus temperature than prior art solder, thereby reducing the $\Delta T$ between the solidus point and room temperature and the deformation of the final assembly.

Other objects will, in part, appear hereinafter and will, in part, be obvious.

SUMMARY OF THE INVENTION

In accordance with the present invention and attainment of the foregoing objects there is provided a solder for joining a wafer of semiconductor material to a metal electrical contact comprising, by weight percent, aluminum 34 to 39%, silver 46% to 50%, germanium 15% to 16% and may contain up to 0.5% boron.

The above specified solder is disposed between a wafer of silicon and a metal electrical contact in a suitable fixture and heated to 700° C. in a furnace. The resultant fused assembly is then cooled to 200° C. in the furnace, and to room temperature outside the furnace.

In the alternative, the surface of the wafer of semiconductor material to be joined to the metal electrical contact may have a silver-germanium alloy disposed thereon prior to being assembled in the fixture. If this alternative is used, a layer of aluminum or aluminum-boron alloy is employed to effect the fusion between the wafer and metal electrical contact.

BRIEF DESCRIPTION OF THE DRAWING

For a better understanding of the nature and objects of the invention, reference should be had to the following detailed description and drawing in which.

DESCRIPTION OF THE PREFERRED EMBODIMENT

Figure 1:
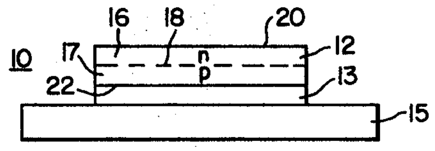
FIG. 1 is a side view, in cross-section, of assembled components suitable for use in accordance with the teachings of this invention.

With reference to FIG. 1, there is shown an assembly 10 to be joined to form an element of a semiconductor device in accordance with the teachings of this invention.

The assembly 10 consists of a wafer 12 of a semiconductor material, a solder layer 13 and a metal electrical contact 15. The wafer 12 is to be joined to the contact 15 by solder layer 13 to form a semiconductor element suitable for use in a semiconductor device.

The wafer 12 of for example silicon, has a region 16 of n-type conductivity and a region 17 of p-type conductivity. There is a p-n junction 18 between regions 16 and 17. The wafer 12 has a top surface 20 and a bottom surface 22.

While the wafer 12 has been shown as having two regions and one p-n junction in FIG. 1, the teachings of this invention are equally applicable to wafers containing any number of regions and junctions. The teachings are applicable to transistors and multiregion switches in addition to diodes.

The solder layer 13 is an alloy consisting of from, all percentages by weight, 34% to 39% aluminum, 46% to 50% silver, and 15% to 16% germanium. In addition, the alloy may contain up to 0.5% boron. The preferred alloy in practicing this invention is one having a composition, all percentages by weight, 36% aluminum, 48% silver, 15.5% germanium and 0.5% boron.

An alloy in the specified range has a solidus temperature of 460° C. and decreases drastically the deformation of the joined assembly as will be explained in detail hereinafter.

The metal electrical contact 15 consists of an electrical and thermal conductive material whose coefficient of thermal expansion closely approximates that of the semiconductor wafer 12. Examples of suitable materials are molybdenum, tungsten, tantalum and base alloys thereof.

Figure 2:
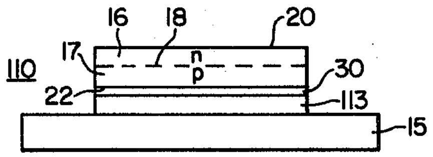
FIG. 2 is a side view in cross-section, of an alternate stack of assembled components suitable for use in accordance with the teachings of this invention.

With reference to FIG. 2, there is shown another assembly 110 to be joined to form an element of a semiconductor device in accordance with the teachings of this invention. Components of the assembly 110 which are the same as those in FIG. 1 have the same identifying numbers.

The assembly 110 consists of a wafer 12 of a semiconductor material, preferably silicon, a metallic layer 30, a solder layer 113, and a metal electrical contact 15. The wafer 12 is to be joined to the contact 15 by metal layer 30 and solder layer 113 to form a semiconductor element suitable for use in a semiconductor device.

The wafer 12 has a region 16 of n-type conductivity and a region 17 of p-type conductivity. There is a p-n junction 18 between regions 16 and 17. The wafer 12 has a top surface 20 and a bottom surface 22.

The metal layer 30 may be deposited on the bottom surface 22 of the wafer 12 by thermal evaporation or any other suitable process known to those skilled in the art. The metal layer 30 consists of a silver-germanium alloy consisting of, by weight percent, 79% silver and 21% germanium.

The solder layer 113 disposed between the metal layer 30 and the metal electrical contact 15 consists of aluminum or aluminum plus 0.5%, by weight, boron.

The composition of the metal layer 30 and the solder layer 113 should be coordinated so that their combined composition is in the range of, by weight percent, 34% to 39%, and preferably 36% aluminum, 46% to 50%, and preferably 40% silver, and 15% to 16%, and preferably 15.5% germanium, and may contain up to 0.5% boron.

The metal electrical contact 15 consists of a metal selected from the group consisting of molybdenum, tungsten, tantalum and base alloys thereof.

In practicing the teachings of this invention, the assembly 12 of either FIG. 1 or 2 is assembled in a suitable fixture and passed into a furnace. The furnace, which may be of tunnel-like configuration, is preferably under a vacuum of at least $10^{-3}$ torr. The furnace has at least two zones: in a first zone, provided with heating means, the assembly either FIG. 1 or 2 is heated to a temperature of about 700° C., whereby, the solder layer of the assembly of FIG. 1 and the solder layer and metal layer of FIG. 2 melt and wet the wafer and metal electrical contact. This heating step may be carried out in a space of a few minutes. The assembly is then passed into a second zone where it is cooled to about 200° C. at the rate of from 5° C. to 15° C. per minute. Finally, the assembly is passed into the ambient where it cools to room temperature.

The furnace may, rather than being under vacuum have a non-oxidizing or reducing atmosphere. Examples of suitable atmospheres include argon gas atmosphere and a hydrogen gas atmosphere having a dew point of about −50° C.

Figure 3:
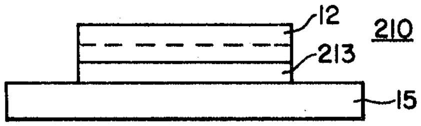
FIG. 3 is a side view, in section, of an assembly made in accordance with the teachings of this invention.

With reference to FIG. 3, the fused assembly thus formed is a semiconductor element 210 suitable for use in a semiconductor device.

The semiconductor element 210 consists of the wafer 12 of semiconductor material bonded to the electrical metal contact 15 by solder layer 213.

The solder layer 213 consists of either the solder layer 13 of FIG. 1 or the solder 113 and metal layer 30 of FIG. 2.

In either case, the solder layer 213 has a solidus temperature of 460° C. It has been found that the stress and deformation resulting in a semiconductor element of the type shown in FIG. 3 is proportional to $\Delta T$ which is the difference between the solidus temperature of the solder and room temperature. Assuming a room temperature of 21° C., $\Delta T$ of applicant's solder is 439° C. while that of prior art devices using either aluminum or aluminum plus 0.5%, by weight, boron, as a solder, which has a solidus temperature of 577° C., has a $\Delta T$ of 536° C.

Eight assemblies of the types shown in FIGS. 1 and 2, four of each, and eight assemblies of the type shown in FIG. 1, except that aluminum was used as a solder in four of the assemblies and aluminum plus 0.5% by weight, boron was used in four other of the assemblies, were prepared and fused into semiconductor elements by heating to 700° C. in a vacuum furnace having a vacuum of $10^{-4}$ torr. The fused assemblies were cooled to 200° C. within the furnace at a rate of from 5° C. to 15° C. per minute, and then removed from the furnace and allowed to cool to room temperature.

Figure 4:
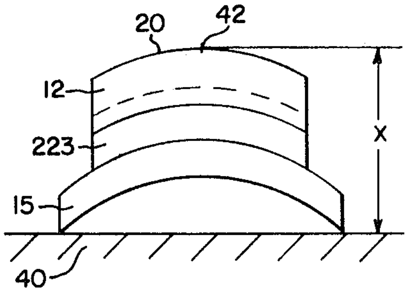
FIGS. 4 and 5 are schematic illustrations of how the degree of deformation of a device of the prior art and a device of this invention were made.
Figure 5:
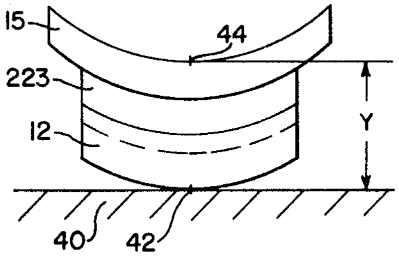

The sixteen semiconductor elements were measured for deformation in the following manner. With reference to FIG. 4, each of the semiconductor elements were disposed on a flat surface 40 with the metal electrical contact 15 in contact with the flat surface 40 and the distance "X" from the flat surface 40 to peak point 42 on top surface 20 of the wafer 12 was measured. With reference to FIG. 5, the semiconductor element was reversed and with peak point 42 in contact with flat surface 40 the distance "Y," from the flat surface 40 to point 44, the lowest point on the bottom surface of the metal electrical contact 15 was measured.

The results of the measurements, are set forth below in tabular form.

TABLE

| Devices prepared in accordance with this invention | | Devices prepared with aluminum with and without boron | |
|---|---|---|---|
| No. | Deformation X-Y in '000 inch | No. | Deformation X-Y in '000 inch |
| 1 | 1.35 | 1 | 1.79 |
| 2 | 1.32 | 2 | 1.73 |
| 3 | 1.38 | 3 | 1.74 |
| 4 | 1.35 | 4 | 1.70 |
| 5 | 1.37 | 5 | 1.75 |
| 6 | 1.34 | 6 | 1.74 |
| 7 | 1.38 | 7 | 1.77 |
| 8 | 1.34 | 8 | 1.72 |
| Average | 1.36 | Average | 1.75 |

The values set forth in the table indicate a reduction of approximately 23% in deformation when the semiconductor element is made in accordance with the teachings of this invention.

This reduction in deformation of the semiconductor element makes possible the fabrication of more reliable semiconductor devices which are capable of handling larger power loads.

I claim as my invention:

1. A semiconductor element comprising a wafer of semiconductor material bonded to a metal electrical contact by a solder consisting essentially of, by weight percent, aluminum 34% to 39%, silver 46% to 50% and germanium 15% to 16% and which may contain up to 0.5% boron, said solder having a solidus temperature of approximately 460° C.

2. The semiconductor element of claim 1 in which the solder consists of, by weight percent, 36% aluminum, 48.5% silver and 15.5% germanium.

3. The semiconductor element of claim 1 in which the solder consists of, by weight percent, 36% aluminum, 48% silver, 15.5% germanium and 0.5% boron.

4. The semiconductor element of claim 3 in which the semiconductor material is silicon and the metal electrical contact is molybdenum.

References Cited

UNITED STATES PATENTS 3,140,536 7/1964 Kuznetzoff 29—473.1
3,273,979 9/1966 Budnick 29—195
3,331,996 7/1967 Green 317—234
3,480,412 11/1969 Duffek et al. 29—195

L. DEWAYNE RUTLEDGE, Primary Examiner

E. L. WEISE, Assistant Examiner

UNITED STATES PATENTS

29—504; 75—134G, 138, 173